United States Patent
Fest

(12) 
(10) Patent No.: US 7,626,378 B1
(45) Date of Patent: Dec. 1, 2009

(54) SIGNAL POWERED A.C. CURRENT TRANSFORMER ELECTRONIC MEASURING CIRCUIT

(76) Inventor: Otto P. Fest, 4016 E. Tennessee St., Tucson, AZ (US) 85714

( * ) Notice: Subject to any disclaimer, the term of this patent is extended or adjusted under 35 U.S.C. 154(b) by 257 days.

(21) Appl. No.: 11/810,557

(22) Filed: Jun. 5, 2007

Related U.S. Application Data

(60) Provisional application No. 60/815,165, filed on Jun. 21, 2006.

(51) Int. Cl.
   *G01R 21/06* (2006.01)
(52) U.S. Cl. .................. 324/142; 324/126; 361/118
(58) Field of Classification Search .......... 324/127, 324/123 C, 142, 143, 253, 260, 509, 512, 324/539, 543; 361/143, 146, 149, 56, 118; 323/357, 356, 358
   See application file for complete search history.

(56) References Cited

U.S. PATENT DOCUMENTS

| | | | |
|---|---|---|---|
| 4,908,569 A | 3/1990 | Fest | |
| 5,077,486 A * | 12/1991 | Marson et al. | 205/728 |
| 6,018,700 A * | 1/2000 | Edel | 702/60 |
| 6,285,094 B1 | 9/2001 | Fest | |

* cited by examiner

*Primary Examiner*—Rajnikant B Patel
(74) *Attorney, Agent, or Firm*—Mark Ogram

(57) ABSTRACT

A self-powered alternating current measuring and power generating circuit is designed to be connected across the terminals of the secondary winding of a current transformer. The circuit includes a current to voltage transformer, the primary winding of which is connected in series at a junction with a resistor across the terminals of the secondary winding of the current transformer. The junction of the resistor and the primary winding of the current to voltage transformer is supplied to a measuring circuit to produce an output coupled to a measuring instrument. Operating power for the measuring circuit is obtained from the secondary winding of the current to voltage transformer through a rectifier; so that the circuitry is energized without requiring additional internal or external power sources.

13 Claims, 1 Drawing Sheet

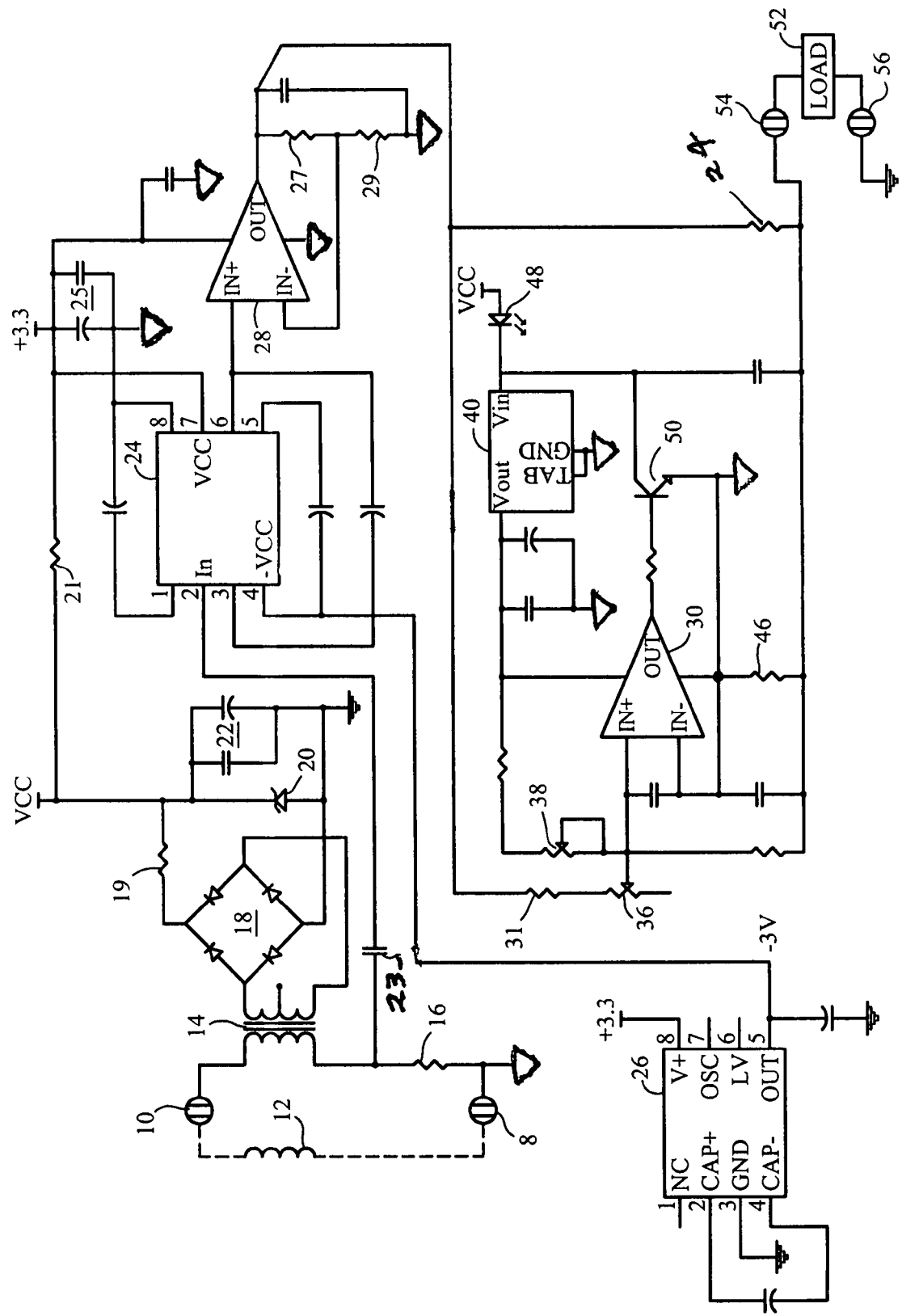

SIGNAL POWERED A.C. CURRENT TRANSFORMER ELECTRONIC MEASURING CIRCUIT

RELATED APPLICATION/PRIORITY DOCUMENT

This patent application corresponds to, and claims the benefit of priority under Title 35 U.S.C. §119(e) of provisional application Ser. No. 60/815,165 filed Jun. 21, 2006, incorporated herein by reference.

BACKGROUND

This invention relates to electric control and monitoring circuits, and more specifically, to systems for measuring the alternating current drawn by loads in household and high voltage mains. The use of current transformers enables the most popular, safe and easy method of measuring the AC current drawn by loads in household and high voltage mains. Current transformers provide isolation used to isolate and scale down high voltage main current to 0-5 amps (typical) to measure the current on the primary and the output to drive analog meters. If electronic instruments are used, they must be externally powered, which increases the complexity and cost and decreases the reliability of the measurements obtained.

Currently, current transformers coupled with 4-20 mA transmitters require external power sources (compliance) for the current loop transmitter (24 VDC typically) to operate.

It is desirable to provide a current to voltage transmitter system which overcomes the disadvantages of the systems of the prior art, and which is driven by the EMF in the secondary winding of the current transformer without requiring additional internal or external power sources to energize the electronic circuitry.

BRIEF DESCRIPTION OF THE DRAWING

The sole drawing FIGURE is a schematic diagram of an embodiment of the invention.

DETAILED DESCRIPTION

The embodiment of the invention shown in the drawing is directed to a system in the form of a current-to-voltage convertor driven by the EMF in the secondary winding of a current transformer. The output of the converter then is utilized to operate or drive an analog meter connected to output terminals of the circuit. The measurements obtained by the meter are isolated from the secondary of the current transformer from which the measurement is obtained without disturbing the quality of the signal provided. There are three sections to the circuit shown in the drawing. They are: 1) POWER CONVERSION, 2) SIGNAL CONVERSION, and 3) SIGNAL TRANSMISSION.

1) Power Conversion

In the circuit shown in the drawing, the input to the circuit is obtained from the secondary winding 12 of a current transformer, the primary winding (not shown) of which is coupled to an alternating current (A.C.) line from which measurements are to be obtained. The winding 12 of the external current transformer is connected across a pair of input terminals 8 and 10 in series with the primary winding of a current-to-voltage transformer 14 and a shunt resistor 16 to complete the loop with the winding 12 of the input current transformer.

The resistor 16 constitutes a current monitor resistor which develops a voltage to be measured across it, and which is indicative of the load which is to be measured by an instrument coupled with the circuit of FIG. 1.

The secondary winding of the transformer 14 is connected across the input terminals of a full wave rectifier 18, which rectifies the alternating current voltage to a direct current voltage whenever the secondary winding 12 is energized by current on its primary. The output of the rectifier 18 is filtered by a filter capacitor set 22; and the voltage from the output terminals of the rectifier 18 is regulated by a Zener diode 20 to prevent the transformer 14 from saturating. As indicated in FIG. 1, the output voltage of the rectifier 18 at the junction of a resistor 19 and the Zener diode 20 is a uni-polar voltage THE VALUE OF WHICH IS DETERMINED BY THE DIODE 20.

2) Signal Conversion

A capacitor 23 is used to AC couple the signal developed across the resistor 16 for an RMS-DC convertor 24 to convert the signal developed across the resistor 16 into its DC (direct current) equivalent. As shown, the RMS to DC convertor 24 is supplied with both the +3.3 VDC and the −3 VDC signals to convert the AC signals into positive DC. The output of the convertor 24 is connected to the input of an operational amplifier 28 which has a feedback loop developed for it across a pair of series-connected resistors 27 and 29 for gain adjustment. The output of the amplifier 28 constitutes a direct current voltage, which is routed to the remainder of the circuit shown in the lower half of FIG. 1 as a measuring circuit, or, alternatively, the output of the amplifier 28 may be transmitted serially to microprocessor-based instruments. It also should be noted that as an extension of the embodiment shown in FIG. 1, the output of the convertor 24 may be multiplied by the VAC of the mains (not shown) to arrive at wattage measurements.

3) Signal Transmission

A) For a 4.20 mA output (diode 20 at 24 Vcc, resistors 21 and 51 are not used). In the circuit shown, the signal generated at the output of the amplifier 28 is coupled through a resistor 31 connected in series with a potentiometer resistor 36 to the input of a second operational amplifier 30. This constitutes the summing junction of the voltage to current (V-I) section through the potentiometer 36 to set the full scale (typically 20 mA). A second potentiometer 38, also coupled to the input of the amplifier 30, sets the low end of the voltage to current (V-I) convertor (typically, 4 mA). The voltage VCC is coupled through a light-emitting diode 48 to the input of a low drop out regulator 40, which produces an output of 3.3 volts to power the internal electronics of the system. All of the internal components of the system are grounded (analog ground) at one side of the resistor 46 to ensure that all quiescent currents are summed and under the 4 mA (zero process) limit. The intensity of the light-emitting diode 48 is used to indicate the status of the loop; and if desired, it can be replaced by a loop powered digital panel meter to display the process value in engineering units. An NPN transistor 50 buffers the output of the operational amplifier 30 to minimize self-heating drifts of the output signal.

A remote load 52 in the form of an analog meter, or other desired "load", is connected across the output terminals 54 and 56. The terminal 56 is connected to system's ground; and the terminal 54 is connected through the resistor 46 to the output of the operational amplifier 28 and the output of the buffer transistor 50.

The center tap of the secondary winding of the transformer 14 may be used in place of the connections to the DC to DC convertor 26 described above in conjunction with the drawing. The use of a DC-DC convertor 26, however, enhances the accuracy of the instrument.

B) for a VDC output (diode 20 at 3.3 V, resistors 21 and 24 are zero Ohms). In a different operation, the Zener diode 20, described above for clamping the output of the rectifier 18 at 3.3 volts by the Zener diode 20, and the output of the amplifier 28 is available at the terminal 54 through the resistor 24. Operating the circuit in this manner eliminates the need for external compliance power supplies presently required by current transformer to 4-20 mA transducers. Other outputs for the load 52 can be devised, such as alarms, serial out, or the like, using the uniqueness of the system which is shown and described above.

Briefly summarizing the foregoing, if the required output signal at the terminals 54 and 56 is voltage and 3.3 VDC power to power traditional digital panel meters, PLC, and the like, the Zener diode 20 could be 3.3 volts DC with the resistors 21 and 51 both at zero Ohms. The signal (typically, 0-2 VDC) would appear across the terminals 54 and 56, and essentially would not assemble the voltage to current section consisting of the regulator 40 and differential amplifier 30 in the lower part of the circuit shown in FIG. 1.

On the other hand, if the required output across the terminals 54 and 56 is a current output in the range of 4-20 mA, the section including the regulator 40 and operational amplifier 30 would be assembled and the Zener diode 20 would be higher voltage (typically a 24 volt Zener) for the purposes of protecting the section including the regulator 40 and amplifier 30 from over-voltages.

Circuit components found satisfactory for use in the system shown include an Analog Devices AD736 for RMS-DC converter 24; a Maxim 7660 for the DC to DC convertor 26; and a Micrel MIC 2950 for the regulator 40.

The foregoing description of an embodiment of the invention is to be considered as illustrative only and not as limiting. Various changes and modifications will occur to those skilled in the art to achieve substantially the same result, in substantially the same way without departing from the true scope of the invention as defined in the appended claims.

What is claimed is:

1. A self-powered alternating current measuring and power generating circuit including in combination: first and second input terminals; a single current to voltage transformer having primary and secondary windings; a resistor connected at a junction in series with the primary winding of the transformer across the first and second input terminals; an RMS to direct current (DC) convertor having an output, and having an input coupled to the junction of the resistor and the primary winding of the transformer, said RMS to direct (DC) conveter having inputs of approximately 3.3 VDC and −3 VDC; a rectifier having an input coupled across the secondary winding of the transformer, and having an output coupled to the convertor to supply operating power to the convertor; and means for coupling a load to the output terminal of the convertor.

2. A circuit according to claim 1 further including a voltage regulator coupled across the output of the rectifier.

3. A circuit according to claim 2 wherein the rectifier is a full wave rectifier.

4. A circuit according to claim 3 wherein the voltage regulator is a Zener diode.

5. A circuit according to claim 4 wherein the means for coupling the output of the convertor with an output terminal includes an operational amplifier.

6. A circuit according to claim 1 wherein the rectifier is a full wave rectifier.

7. A circuit according to claim 1 wherein the means for coupling the output of the convertor with an output terminal includes an operational amplifier.

8. A circuit according to claim 7 further including a voltage regulator coupled across the output of the rectifier.

9. A circuit according to claim 8 wherein the voltage regulator is a Zener diode.

10. A method for extracting the voltage equivalent of a current flowing through the primary winding of a current to voltage transformer including: obtaining an input voltage signal from the current flowing through the primary winding of the current to voltage transformer; deriving direct current operating voltage from the transformer; using the direct current operating voltage of approximately 3.3 volts DC and −3 VDC to power an RMS-DC convertor; supplying the input voltage signal to the RMS-DC convertor; and obtaining an output from the RMS-DC convertor representative of current flowing in the primary winding of the current to voltage transformer.

11. The method according to claim 10 further including: supplying the output of the RMS-DC convertor to a load.

12. The method according to claim 11 further including: preventing saturation of the current-to-current transformer.

13. The method according to claim 10 further including: preventing saturation of the current-to-voltage transformer.

* * * * *